United States Patent [19]
Antonello et al.

[11] Patent Number: 6,118,292
[45] Date of Patent: Sep. 12, 2000

[54] METHOD AND DEVICE FOR CORRECTING MISALIGNMENT BETWEEN TEST NEEDLES AND TEST POINTS DURING ELECTRICAL TESTING OF PRINTED CIRCUIT BOARDS

[75] Inventors: Gianpaolo Antonello; Graziano Bagioni; Alberto Giani, all of Verona, Italy

[73] Assignee: Circuit Line SPA, Verona, Italy

[21] Appl. No.: 08/977,548

[22] Filed: Nov. 25, 1997

[30] Foreign Application Priority Data

Feb. 18, 1997 [IT] Italy .................................. MI97A0337

[51] Int. Cl.[7] .................................................. G01R 1/04
[52] U.S. Cl. .......................................... 324/758; 324/761
[58] Field of Search ................................... 324/754, 755, 324/758, 72.5, 761

[56] References Cited

U.S. PATENT DOCUMENTS

| | | | |
|---|---|---|---|
| 4,774,462 | 9/1988 | Black | 324/758 |
| 4,812,754 | 3/1989 | Tracy et al. | 324/754 |
| 4,818,933 | 4/1989 | Kerschner et al. | 324/754 |
| 4,829,241 | 5/1989 | Maelzer | 324/754 |
| 5,523,698 | 6/1996 | Antonello et al. . | |
| 5,572,144 | 11/1996 | Davidson et al. | 324/755 |
| 5,614,819 | 3/1997 | Nucci . | |

FOREIGN PATENT DOCUMENTS

| | | |
|---|---|---|
| 0 831 332 | 3/1998 | European Pat. Off. . |
| 44 06 538 | 8/1995 | Germany . |
| 44 38 316 | 11/1995 | Germany . |
| 2 285 682 | 7/1995 | United Kingdom . |

OTHER PUBLICATIONS

Patent Abstract of Japan, vol. 016, No. 211, May 19, 1992 and Japanese Patent 4–38480, Feb. 7, 1992.

*Primary Examiner*—Josie Ballato
*Assistant Examiner*—Minh Tang
*Attorney, Agent, or Firm*—Burns, Doane, Swecker & Mathis, L.L.P.

[57] ABSTRACT

A method for correcting misalignment between test needles and test points during multiple electrical tests on printed circuit boards, in which setting up the machine to carry out the test on a circuit board or group of circuit boards, and hence correction of any misalignment, takes place without removing the circuit boards from the test area. The invention also relates to a device for correction of misalignment, that uses one or more mobile plates (80, 110), depending upon whether the test is performed on only one side or on both sides of the printed circuit board, both mobile plates being disposed on the same interface (1) of the test machine and operating respectively on centering pins (50) of the printed circuit board (10) and on centering pins (50') carried by a mobile structure of the other interface (1') of the test machine, the mobile plates (80, 110) being moved by at least three respective linear actuators (90, 130) acting on respective outer edges of the plates, to give them a rotational translational motion.

17 Claims, 3 Drawing Sheets

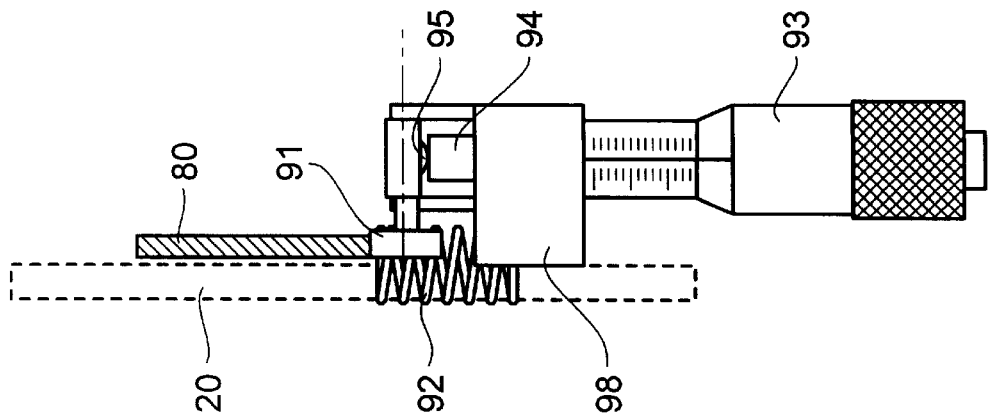
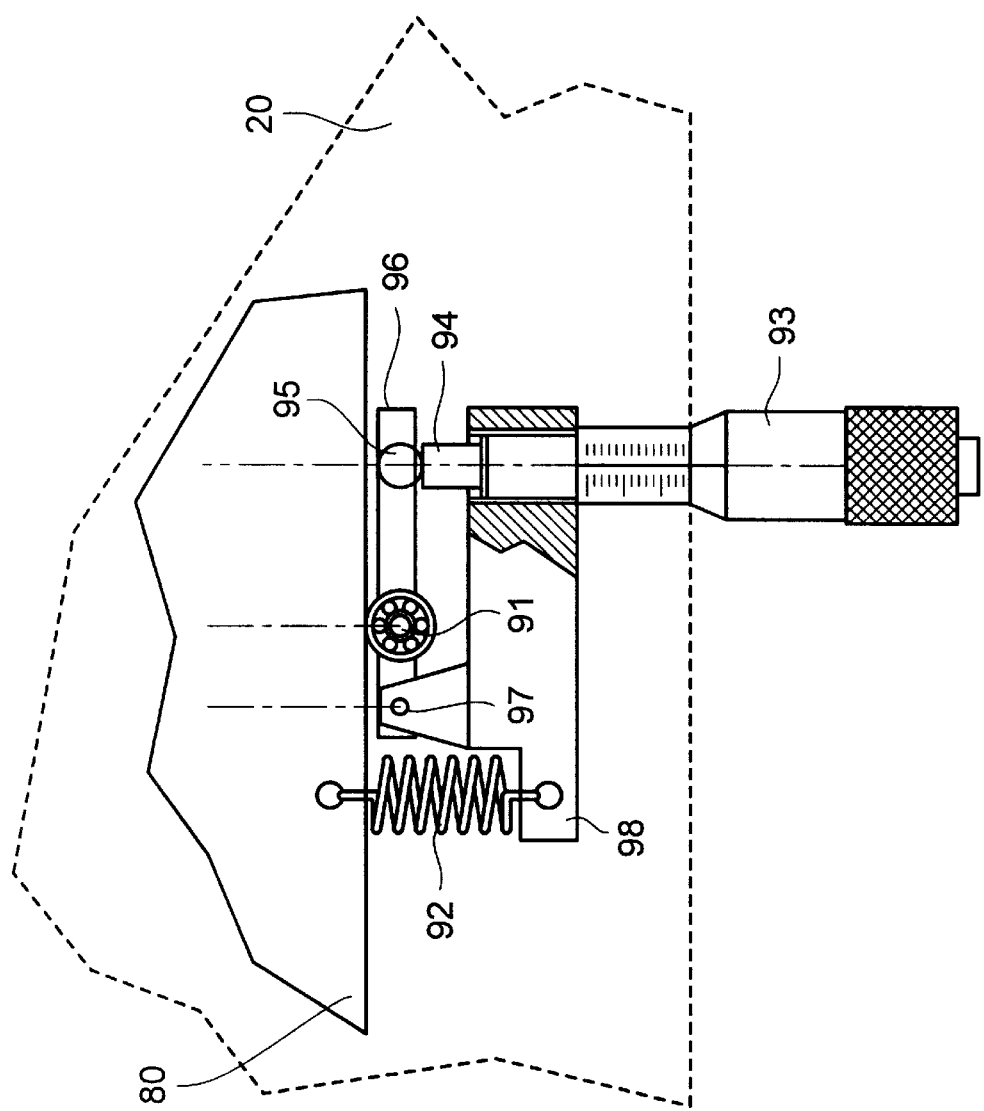

METHOD AND DEVICE FOR CORRECTING MISALIGNMENT BETWEEN TEST NEEDLES AND TEST POINTS DURING ELECTRICAL TESTING OF PRINTED CIRCUIT BOARDS

BACKGROUND AND SUMMARY OF THE INVENTION

The present invention relates to a method for correcting misalignment between the test needles and test points during electrical testing of printed circuit boards, in particular multiple tests, that is tests on a plurality of printed circuit boards. The invention also relates to an actuating device for correction of this misalignment.

A printed circuit board (PCB) is a base of insulating material on which electrical connections are marked, normally by a chemical subtractive process, to link the various components that are to be installed, generally by soldering, on said circuit.

These printed circuit boards are tested before installation of the components, that is to say, they are checked and analyzed to ensure that all the nets present on the board are insulated from each other and that there is electrical continuity between all points in each net.

The electrical test stage for a printed circuit board therefore comes at the end of the production cycle of the circuit. The machines used to carry out this type of test normally operate with a universal contact grid, that is, with a constant pitch (generally 100 mils; 2.54 mm), also known as a "needle bed".

Since the printed circuit board to be tested has connection points between the different components arranged in a variable manner—and therefore not referable to a constant pitch grid—in order to perform the test an interfacing device (adapter or fixture) is inserted that allows the test points on the printed circuit to be electrically connected to the measuring points of the machine (belonging to the universal grid). In order to allow a correct electrical connection between the circuit board and the machine, the circuit board must be precisely positioned on the interfacing device.

The consolidated method for ensuring positioning of the circuit board on the interfacing device is to use pins which, being installed on the interfacing device, engage in suitable mechanical service holes provided on the circuit board itself.

With this method, the precision of the positioning of the circuit board to be tested with regard to the interfacing device is affected by errors in the construction of the circuit board itself and of the interface. Errors in the construction of the printed circuit board can thus make it impossible to perform the electrical test, irrespective of the actual final functioning of the printed circuit board.

It is known that by correcting the relative position of the reference pins and the interface, some types of errors in construction of printed circuit boards can be corrected, allowing electrical testing to be performed (see for example Italian patent application No. MI96/A 000273 in the name of the same applicant).

Besides single tests, that is on only one printed circuit board, it is fairly common practice to perform multiple simultaneous tests, that is on more than one printed circuit board in the same test operation, taken as one test machine cycle. The single printed circuit boards can be physically separate from each other, or arranged on a single plate or panel of base material, which is subjected to electrical testing before the various circuits provided on it are physically separated from each other.

Each circuit board being tested can be characterized by an error which can be qualitatively and quantitatively different from those of the other circuit boards under simultaneous testing.

In these cases it is not possible to perform a single test on all the circuit boards arranged in the test area of the machine, because the results would be altered by the circuit board centering error.

A possible alternative to this could be to test the various circuit boards individually, removing the plate from the test area each time to reposition it in the correct position, according to the circuit board to be tested.

This procedure, however, seems extremely long and laborious.

An object of the invention is to eliminate this drawback, in so-called multiple tests, avoiding removal of the plate after each single test, to perform possible correction of the positioning error.

Another object of the invention is to permit such multiple tests on both sides of said circuit boards without removing the plate containing the circuit boards.

Yet another object of the invention is to provide an extremely reliable device that makes it possible to perform rapid and safe correction of the positioning error of the individual circuit boards in the various stages of the multiple test.

The method for correction of the misalignment between the test needles and the test points during multiple tests on printed circuit boards is described below.

Basically, a system of micrometic movement servoactuators is provided, which makes it possible to assign desired movements to the circuit board centering pin assembly, installed in an interface, advantageously the lower one, though maintaining the reciprocal distance between the pins unchanged.

By suitably guiding the test machine, the necessary movements can be assigned to the pin assembly to correct the position of one or more printed circuit boards being tested simultaneously in the same machine cycle, and perform the test solely on that board; the necessary movements are then assigned in succession to correct the position on the interface of the other circuit boards, but always one (or more) at a time, thus performing the test individually on each circuit board.

BRIEF DESCRIPTION OF THE DRAWINGS

Further characteristics of the invention will be made clearer by the detailed description that follows, referring to a purely exemplary, and therefore non-limiting, embodiment thereof, illustrated in the appended drawings, in which:

FIGS. 4a and 4b are respectively a diagrammatic plan view from above and a side view of a linear correction actuator.

DETAILED DESCRIPTION

Figure 1:
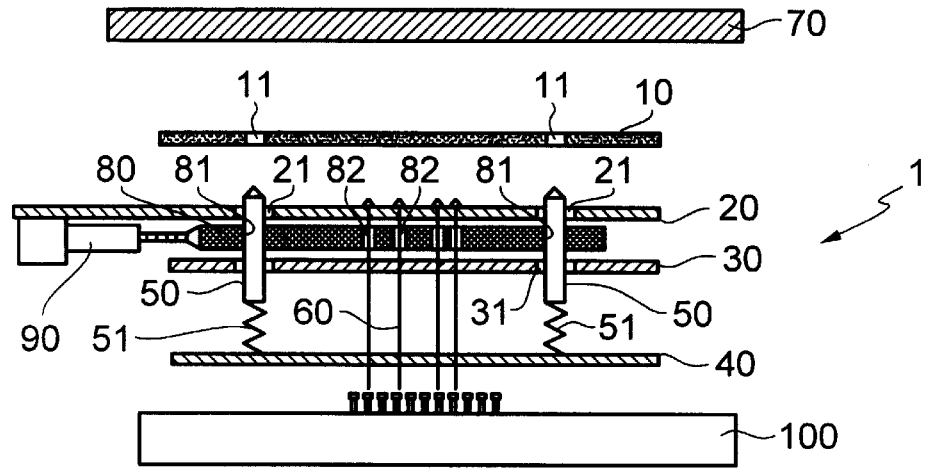
FIG. 1 is a diagrammatic view in cross section of the test assembly of a test machine for electrically testing only one side of printed circuit boards, with a device for correction of misalignment between the test needles and test points.

Referring in particular to FIG. 1, the method for correction of misalignment will now be illustrated in the case of multiple tests on a single side of the printed circuit board.

In FIG. 1, reference numeral 10 indicates the circuit board being tested, or rather a panel containing a plurality of circuit boards for testing, 100 indicates the universal measurement point grid of the test machine, 1 indicates the lower interface device as a whole, interposed between the universal grid 100 and the panel 10, whereas 70 indicates a pressure unit of the machine, which provides the necessary force to make the electrical contact between the universal grid and the printed circuit board; in the case of simultaneous testing of both sides of the circuit board, a second interface, or upper interface, is interposed between the pressure unit 70 and the panel 10.

The interface 1 comprises an upper plate 20, a lower plate 40 and a possible intermediate plate 30, all integral with each other. Centering pins 50 for the panel 10 are elastically mounted on the lower plate 40 by means of springs 51. The conical end of the pins 50 allows coupling without any play between the pins and the corresponding holes 11 made in the panel 10, whilst the springs 51 compress to allow the panel 10 to rest on the upper plate 20 of the interface 1.

The centering pins 50 pass in respective holes 21, 31 of the upper plate 20 and of the intermediate plate 30, having a greater diameter than that of the pins, so as to allow a certain radial movement thereof, following the movement of the mobile guide plate 80 of the centering pins 50. The mobile plate 80 is operated by micrometric movement servoactuators 90, only one of which is shown in FIG. 1.

Also situated in the interface 1 are the test needles 60, which allow the universal grid 100 to be connected to the test points on the surface of the circuit boards undergoing testing, the position of which may not be vertical to a point on the grid 100 of the machine.

The holes 81 through which the centering pins 50 on the plate 80 pass have the same diameter as the pins and a degree of tolerance H7, whereas the pins have a degree of tolerance H9. This makes it possible for the pins 50 to have a radial play of 0.01 mm in their holes 81, so as to allow axial sliding of the centering pins. The thickness of the plate 80, possibly increased locally, makes it possible to limit angular sliding of the pin in its hole. The plate 80 is positioned inside the interface 1, immediately below the upper plate 20 thereof. The mobility of the plate 80 with respect to the rest of the interface 1 is obtained by making the holes 82 through which the test pins 60 pass and the holes for any internal spacers (see FIG. 3) with a radius that is increased with respect to the original one by an amount equal to the maximum desired movement to be imposed on the plate 80.

The method for correction of the misalignment between the test needles and test points during multiple electrical testing is carried out as follows:

1. The correction value to be assigned for each circuit board of the panel 10 being tested is determined preliminarily.

2. With a special machine control software not forming the subject matter of the present invention, the machine is set to carry out the test on only one of the circuit boards contained in the panel 10. Through the micrometric servoactuators 90, rigidly constrained to the interface 1, a movement (generically a flat rotational translational movement) is imparted to the plate 80 guiding the pins 50 with springs 51, so that the entire panel 10 is positioned by the centering pins 50 so that the test points of the circuit board to be tested couple with the test needles 60 of the interface.

3. The panel 10 is positioned on the interface 1, inside the test machine, with the mechanical service holes 11 coinciding with the centering pins 50 of the interface.

4. The test cycle is then started: the pressure unit 70 presses the panel 10 against the spring-loaded pins 50 which ensure positioning of the panel; the compression continues until the electrical connection between the circuit and the measuring point grid 100 of the machine is made, through the test needles 60.

5. On completion of testing of the first circuit board (or possibly of a plurality of circuit boards), the pressure unit 70 is raised by the minimum amount necessary for the panel 10 to be no longer in contact with the pressure unit 70.

6. The machine is set via software for execution of the test on the next circuit board contained in the panel 10, and at the same time, the servoactuators 90 of the plate 80 are guided to make the test points of the next circuit board coincide with the relative test needles 60 of the interface 1. In other words, the panel 10 is moved by the centering pins 50, without being removed from the machine, in order to correct any misalignment between the test points of the circuit to be tested and the test needles 60.

7. The actions described in points 4, 5 and 6 are repeated for each of the circuits being tested, or for each group of circuits, whether they are contained in the same panel 10 or physically separated but simultaneously present on the interface 1 during the test cycle.

8. At the end of testing of all circuit boards placed on the interface 1, the pressure unit 70 is raised completely and the circuit boards are removed from the interface.

The method for carrying out movement of the guide plate 80 for the centering pins 50 of the circuit board will now be described in brief.

Figure 2A:
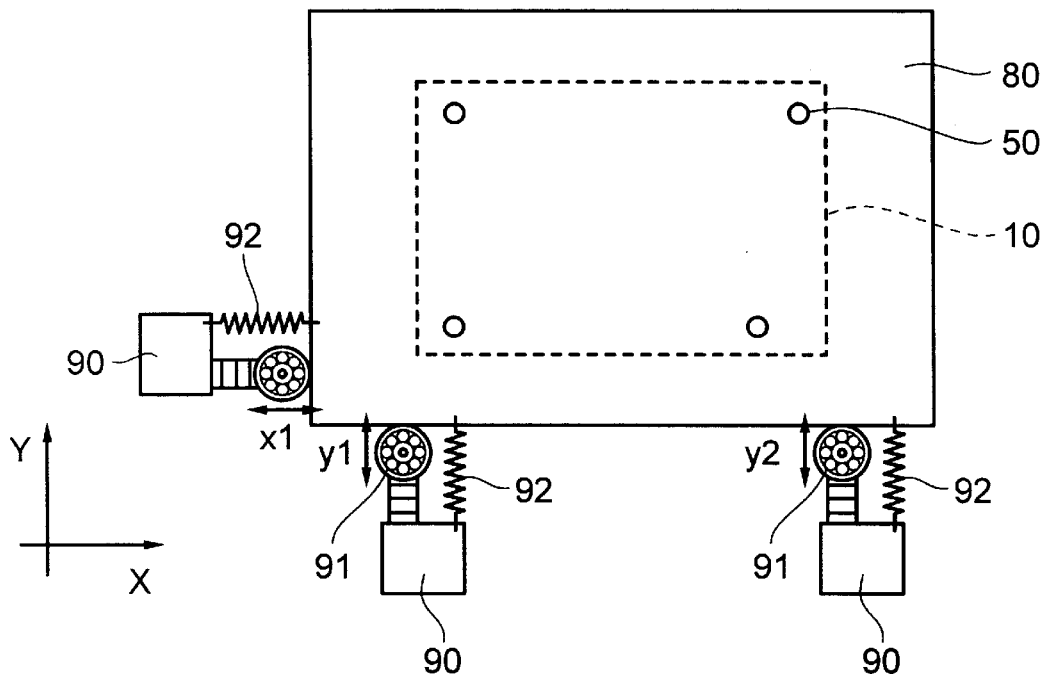
FIGS. 2a and 2b are diagrammatic plan views of the guide plate of the circuit board centering pins, showing said guide plate in two different positions, following a rotational translational movement.
Figure 2B:
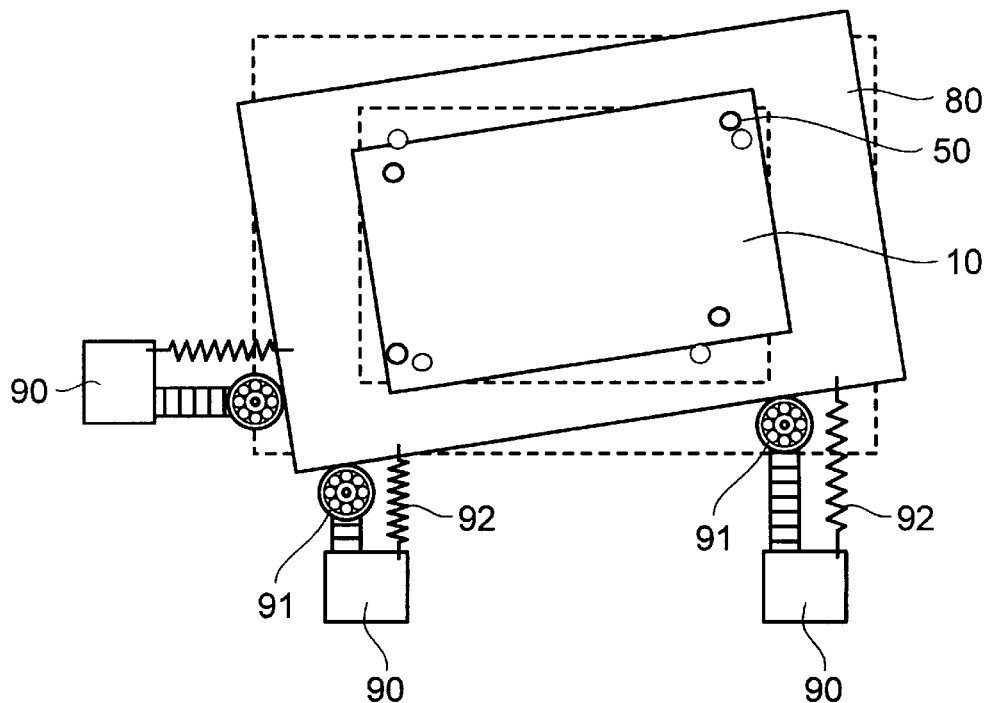

The system outlined in FIGS. 2a and 2b allows generic rotational translational movements to be assigned to the plate 80, eliminating play in the points at which the servoactuators 90 are constrained to said plate.

FIG. 2a and FIG. 2b shows the guide plate 80 for the centering pins 50 of the printed circuit board 10. To carry out rotational translational movements of the plates 80 three linear micrometric movement servoactuators 90 are provided, which act on the pivot of a respective radial ball bearing 91, in contrast with a return spring 92 which connects each servoactuator 90 to the plate 80.

Knowing the theoretical position with respect to an absolute reference system that the plate 80 should assume to guide the centering pins 50 of the circuit board 10 in the position relative to circuit boards without errors of construction, and also knowing the position of the contact points of the bearings 91 with the mobile plate 80, the three movements x1, y1, y2 shown in FIG. 2a can be assigned and will have the effect of causing the flat rotational translational movement to bring the plate into the "correct" position of FIG. 2b (it is known that a generic planar rigid movement can always be referred to the sum of a translational movement of the object and a rotational movement around a point in the plane). The correct position is that in which the centering pins 50 of the circuit board 10, integral with the plate 80, bring the circuit 10 to take on a position with regard to the interface 1 such that the test points on its surface couple exactly with the test needles that emerge from the upper plate 20 of the interface 1.

Figure 3:
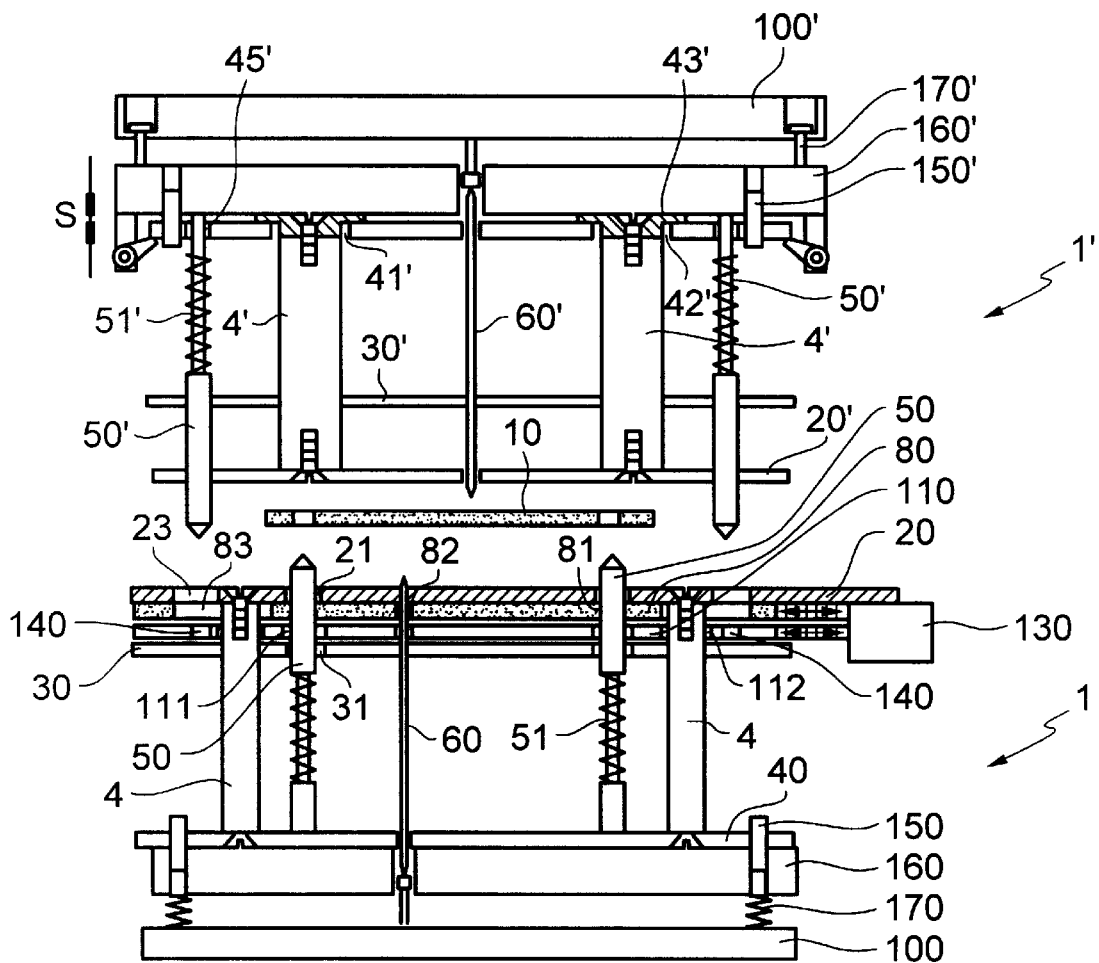
FIG. 3 is a diagrammatic cross section of a possible configuration for simultaneously testing both sides, with the possibility of adjusting the relative position between the circuit being tested and the relative interfaces.

With reference to FIG. 3, the method for adjusting the misalignment between test needles and test points in the case of simultaneous testing on both sides of the printed circuit board 10 will now be described.

In this case, besides the previously described lower interface 1, a perfectly symmetrical upper interface 1' is used.

In the description that follows, the various elements of the upper interface 1' corresponding to respective elements of the lower interface 1, will be indicated with the same reference numerals followed by a prime.

In FIG. 3 the structure of the lower interface is shown in greater detail than in FIG. 1, in that, for example, the distance pieces 4, connecting the lower plate 40 and the upper plate 20, are shown. Also shown is how the lower interface 1 is disposed on the lower universal measuring point grid 100 of the test machine, by means of springloaded centering elements 170 that act between this grid 100 and a plate 160 that protects the measurement points and supports the lower interface 1. The protecting and supporting plate 160 is fixed to the lower plate 40 of the interface 1 by means of pins 150.

With respect to FIG. 1, in the case of simultaneous testing of both sides of the printed circuit board 10, according to the invention, a second mobile centering plate operated by actuators 130 is provided in the lower interface 1. The mobile plate 110 is disposed beneath the mobile plate 80, between the latter and the intermediate plate 30, and has holes 140 to engage centering pins 50' carried by the upper interface 1', as will be better described below.

The upper interface 1' comprises a lower plate 20', an upper plate 40' and an intermediate plate 30', corresponding to plates 20, 30 and 40, respectively, of the lower interface 1. The lower plate 20' and upper plate 40' are connected to each other by spacers 4'. The interface 1' is constrained to a supporting plate 160' by means of reference pins 150'. And the plate 160' is in turn constrained by means of centering and vertical sliding elements 170' to the upper universal measuring points grid 100' of the test machine, and also serves to protect the measuring points.

As can be seen in FIG. 3, the upper plate 40' of the upper interface 1' is provided with holes 41' coinciding with the inner spacers 4', whose diameter allows said spacers to move radially to the hole. The plate 40' is positioned rigidly by means of reference pins 150' on the plate 160', in turn fixed to a grid 100'. The remaining components of the interface 1' are constrained rigidly to one another and are mobile with respect to the grid 100' of the machine, thanks to the radial play of the inner spacers 4' in the holes 41' of the plate 40'. The spacers end at the top in a washer 42', the flange 43' of which prevents the plate 40' from separating from the interface 1'.

The thickness of the flange 43' of these washers 42' is smaller than the distance "s" at which the interface is kept by the plate 160'. This allows movement of the spacers 4' (and of the structure of the interface 1' connected to them) without friction forces being generated against the plate 160'. The holes 45' for passage of the pins 50' in the upper plate 40' have such a diameter as to allow radial movement of the pins 50' when these move together with the mobile portion of the interface. The diameter of the through holes in the remaining plates, on the other hand, is the minimum necessary to obtain axial sliding of the pins 50' (typically 0.01–0.03 mm).

The centering action, or movement of the mobile part of the interface 1' is achieved by means of the pins 50' of the upper interface 1' which engage in the holes 140 in the mobile plate 110. The pins enter into contact with the plate 110 before the interface 1' has entered into contact with the circuit board 10.

By assigning a movement by means of the actuators 130 to the plate 110, the pins 50' are returned toward the centre of the holes 140 that are situated in the "correct" position, thus transferring forces to the mobile structure of the interface. These forces cause movement of this mobile structure of the interface 1', that is of the elements situated beneath the upper plate 40'. The extent of this movement is to be considered within 0.5 mm. The test needles 60' allow this movement thanks to the diameters of the holes in the plates of the interface 1' and to a small extent also thanks to their ability to bend.

With the solution according to the invention, all the adjustment actuating elements are kept inside a single interface, in particular the lower interface, applying small modifications to the structure of the other interface 1'.

To allow the plate 110 its mobility, it is provided with holes 111 with a larger diameter than the pins 50 and with holes 112 with a larger diameter than the spacers 4.

Naturally, the mobile plate 80 and the upper plate 20, in alignment with the holes 140 of the mobile plate 110, are provided with respective holes 83, 23 for passage of the centering pins 50' of the upper interface 1'.

With reference to FIGS. 4a and 4b an exemplary embodiment of the linear correction actuators of the mobile centering plates 80 and 100 will now be described, referring to a correction actuator 90 of the plate 80, but it being obvious that this also applies to the case of an actuator 130 of the mobile plate 110.

The actuating system shown comprises a micrometric drive head 93. The pusher 94 of the head 93 acts on a ball 95 of highly resistant material (for example a ball for ball bearings). The ball 95 is inserted by negative tolerance in a recess in a rocker arm 96. The rocker arm 96 turns around a pivot 97 and pulls the radial ball bearing 91, integral with it, against the mobile guide plate 80 of the circuit board centering pins 50, not shown in FIG. 4. The plate 80 is maintained constantly in contact with the bearing 91 by the action of a return spring 92, acting between the mobile plate 80 and a supporting block 98 of the actuator structure, constrained to the structure of the interface 1.

The ratio between lengths "a" and "b" indicated in FIG. 4a, represents the reduction ratio that the rocker arm 96 makes it possible to achieve between the movement of the inner pusher 94 of the micrometric head 93 and the actual orthogonal component at the side of the plate 80 of the movement of the bearing 91, that is of the plate itself. Thus, if the ratio "b/a"=5, if the micrometric head has a resolution of 0.01 mm, movements of 0.01/5=0.002 mm can be resolved. The presence of a return spring 92 ensures that any mechanical play is taken up. The precision and accuracy of the actual movement of the plate 80 obtained depend largely on the surface finish of the edge of the plate, where the bearing 91 comes to rest.

In the example described, the micrometric head 93 is operated manually by an operator to assign the desired movement.

It is nevertheless obvious that the linear actuator can be motorized, that is the movement of the head 93, or an organ equivalent to it, can take place in an automated manner, for example with ball bearing microscrews driven by step by step or direct current motors with a closed circuit (negative feedback) control system. With this configuration, the system can be automated and controlled with software devices.

We claim:

1. A method for correcting misalignment between test needles and test points during multiple electrical tests on printed circuit boards, comprising the steps of:

a. making a preliminary determination of a correction value to be assigned, for each circuit board being tested;

b. setting a test machine, through appropriate control software, to carry out the test on at least one circuit board under testing, including positioning of said at least one circuit board so that respective test points couple with corresponding test needles of an interface of the test machine;

c. closing the test machine and initiating performance of the test cycle;

d. on conclusion of the test on a first of said at least one circuit board, partially opening the test machine and setting the test machine through software, without removal of the circuit boards, for testing of a second of said at least one circuit board, including positioning the second circuit board with respective test points coupled with corresponding test needles;

e. repeating step d until there are no more circuit boards left to test;

f. opening the test machine for removal of the tested circuit boards.

2. A method according to claim 1, in which the printed circuit boards undergoing the multiple test are provided on supports physically separated from each other at the time of the test.

3. A method according to claim 1, in which said printed circuit boards subjected to the multiple test are contained on at least one panel from which they are physically separated after the test.

4. A method according to claim 1, wherein a second corresponding interface is provided in the test machine in opposing relation to the interface, the method further comprising performing steps a to e on both sides of the printed circuit boards simultaneously.

5. A method according to claim 4, wherein the step of setting the machine to carry out the test on both sides of the printed circuit board, and hence to correct misalignment between the test points provided on the two sides of the printed circuit boards and corresponding test needles, is performed by means situated on only one of the two interfaces of the test machine.

6. A method according to claim 5, wherein the step of setting the test machine to perform the test on said at least one printed circuit board includes controlling a mobile plate that acts on printed circuit board centering pins.

7. A method according to claim 6, wherein the step of setting the test machine to perform the test on the other side of a printed circuit board of a group of printed circuited boards further includes controlling another mobile plate acting on centering pins of the corresponding interface.

8. A device for correction of misalignment between test needles and test points in a test machine for electrical testing of printed circuit boards, comprising a mobile plate situated in an interface of the test machine for adjusting centering pins for engaging centering holes of a printed circuit board, at least three linear actuators mounted at two edges of said mobile plate to give rotational translational movements to the mobile plate, at least one of said actuators mounted for exerting a thrust on the mobile plate in a perpendicular direction to the other two actuators.

9. A device according to claim 8, wherein said linear actuators each include radial ball bearings in contact with the outer edge of the mobile plate to allow relative movement, and return springs connecting the linear actuator and the mobile plate for maintaining contact therebetween.

10. A device according to claim 9, wherein each linear actuator includes a rocker arm hinged at one end to a fixed support and a pusher coupled at the other end of the rocker arm, the pusher providing an axial movement thrust for rocking the rocker arm, and wherein the radial ball bearing is mounted on the rocker arm.

11. A device according to claim 10, wherein said pusher acts against a ball of a highly resistant material inserted by negative tolerance in a recess in the rocker arm.

12. A device according to claim 10, wherein said pusher is driven manually by a micrometer head.

13. A device according to claim 10, wherein said pusher is driven by a motorized linear actuator.

14. A device according to claim 8, further comprising an upper plate and an intermediate plate, said mobile plate being interposed between the upper plate and the intermediate plate of the interface of the test machine, wherein the interface is positioned for the test on an underside of the printed circuit board.

15. A device according to claim 8, in which the test machine carries out the simultaneous test on both sides of the printed circuit board, wherein said interface is a lower interface for testing a lower side of a printed circuit board, the device further comprising an upper interface for testing an upper side of a printed circuit board, and wherein a second mobile plate is disposed in the lower interface to cooperate with the centering pins of the lower interface.

16. A device according to claim 15, wherein said second mobile plate is controlled by at least three actuators wherein each linear actuator includes a rocker arm hinged at one end to a fixed support and a pusher coupled at the other end of the rocker arm, the pusher providing an axial movement thrust for rocking the rocker arm, a radial ball bearing mounted on the rocker arm and in contact with an outer edge of the mobile plate, and a return spring connecting the rocker arm to the outer edge of the mobile plate for maintaining contact therebetween.

17. In a machine for multiple electrical tests on a plurality of printed circuit boards physically separated from each other, a device for correction of misalignment between test needles and test points in the test machine, the device comprising a mobile plate situated in an interface of the test machine for adjusting centering pins for engaging centering holes of a printed circuit board, at least three linear actuators mounted at edges of said mobile plate to give rotational translational movements to the mobile plate, at least one of said actuators mounted for exerting a thrust on the mobile plate in a perpendicular direction to the other two actuators, wherein setting the machine for execution of the test on a printed circuit board or group of printed circuit boards is performable without removing the printed circuit boards from the test machine.

* * * * *